United States Patent
Ogawa et al.

(10) Patent No.: US 10,056,281 B2
(45) Date of Patent: Aug. 21, 2018

(54) CONTAINER TRANSPORT FACILITY

(71) Applicant: Daifuku Co., Ltd., Osaka-shi (JP)

(72) Inventors: Daisuke Ogawa, Komaki (JP); Akihiro Iwanaga, Komaki (JP); Ayato Takada, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/353,036

(22) Filed: Nov. 16, 2016

(65) Prior Publication Data
US 2017/0140965 A1 May 18, 2017

(30) Foreign Application Priority Data
Nov. 17, 2015 (JP) .................................. 2015-225078

(51) Int. Cl.
*H01L 21/67* (2006.01)
*H01L 21/677* (2006.01)
*H01L 21/673* (2006.01)

(52) U.S. Cl.
CPC .... *H01L 21/67733* (2013.01); *H01L 21/6773* (2013.01); *H01L 21/67393* (2013.01); *H01L 21/67727* (2013.01); *H01L 21/67736* (2013.01); *H01L 21/67769* (2013.01); *H01L 21/67775* (2013.01); *B65G 2201/0297* (2013.01)

(58) Field of Classification Search
CPC ......... H01L 21/67393; H01L 21/67727; H01L 21/6773; H01L 21/67733; H01L 21/67736; H01L 21/67769; H01L 21/67775; B65G 2201/0297

USPC .......................................................... 141/98
See application file for complete search history.

(56) References Cited

U.S. PATENT DOCUMENTS

| | | | | |
|---|---|---|---|---|
| 6,637,998 | B2 * | 10/2003 | Langan | ............. H01L 21/67724 414/217 |
| 9,064,921 | B2 * | 6/2015 | Shin | ................... H01L 21/67772 |
| 9,230,845 | B2 * | 1/2016 | Otsuka | .................... A47F 10/00 |
| 9,520,311 | B2 * | 12/2016 | Otsuka | ............. H01L 21/67393 |
| 9,541,534 | B2 * | 1/2017 | Otsuka | ............... G01N 33/0009 |
| 9,679,795 | B2 * | 6/2017 | Otsuka | ............. H01L 21/67769 |
| 2013/0313071 | A1 | 11/2013 | Kasuya et al. | |
| 2015/0000785 | A1 * | 1/2015 | Shin | ........................ F17C 5/007 141/4 |

FOREIGN PATENT DOCUMENTS

| | | | |
|---|---|---|---|
| JP | 2013245032 A | 12/2013 | |
| JP | 201512042 A | 1/2015 | |

* cited by examiner

*Primary Examiner* — Timothy L Maust
(74) *Attorney, Agent, or Firm* — The Webb Law Firm

(57) ABSTRACT

A transport apparatus transports a container that includes a flow hole forming portion in which a flow hole through which gas can flow between the outside and the inside of the container is formed. A connecting portion that has a flow path through which gas can flow and a filling gas supply source that allows a filling gas to flow through the flow path are provided in the transport apparatus. The connecting portion is configured to be switchable between a non-connected state in which the connecting portion is retracted to the outside of a moving region of the container that moves along a transport path and a connected state in which the connecting portion enters the inside of the moving region and is connected to the flow hole forming portion of the container.

7 Claims, 10 Drawing Sheets

CONTAINER TRANSPORT FACILITY

CROSS-REFERENCE TO RELATED APPLICATION

This application claims priority to Japanese Patent Application No. 2015-225078 filed Nov. 17, 2015, the disclosure of which is hereby incorporated in its entirety by reference.

FIELD OF THE INVENTION

The present invention relates to a container transport facility including a first apparatus that includes a pickup portion at which a container that accommodates an article is picked up, a second apparatus that includes a dropoff portion at which the container is dropped off, a transport apparatus that transports the container from the first apparatus to the second apparatus along a transport path, and a supply apparatus that supplies an adjustment gas for adjusting an internal environment of the container to the inside of the container.

BACKGROUND

As an example of the aforementioned first apparatus or second apparatus, JP 2015-012042A discloses a storage rack that stores containers that accommodate semiconductor wafers. The storage rack in JP 2015-012042A includes a plurality of housing portions that each house a container, and a supply apparatus that supplies nitrogen gas for preventing oxidation and contamination of the semiconductor wafers to the stored containers as a filling gas.

A storage rack such as that disclosed in JP 2015-012042A is installed in a semiconductor manufacturing facility. In semiconductor manufacturing facilities, the first apparatus and the second apparatus are not necessarily always provided in proximity to each other, and there are cases where containers need to be transported between the first apparatus and the second apparatus that are installed at separated positions. It should be noted that, as an example of the cases where the first apparatus and the second apparatus are installed at separated positions, a case is conceivable in which, as disclosed in JP 2013-245032A, a plurality of work zones are present in a semiconductor manufacturing facility, and a work zone in which the first apparatus is installed and a work zone in which the second apparatus is installed are different work zones. In JP 2013-245032A, as a transport apparatus that transports containers between the above-described different work zones, overhead transport vehicles and a conveyor that moves a placement portion on which a transport object is placed, along a transport path, are used.

However, in a transport apparatus such as that disclosed in JP 2013-245032A, during transportation of a container between a plurality of apparatuses, the container cannot be filled with nitrogen gas. For this reason, there is a risk that, if it takes a long time for the transport apparatus to transport the container, the concentration of inert gas within the container may decrease. Therefore, there is the problem in that it is difficult to maintain, in the inside of the container, a suitable environment for maintaining the quality of semiconductor wafers.

Thus, it is desired to provide a container transport facility in which, even when it takes a long time for transportation between the first apparatus and the second apparatus, a suitable environment for maintaining the quality of an accommodated article is easily maintained inside the container.

SUMMARY OF THE INVENTION

A container transport facility according to the present disclosure includes a first apparatus including a pickup portion at which a container that accommodates an article is picked up, a second apparatus including a dropoff portion at which the container is dropped off, a transport apparatus that transports the container from the first apparatus to the second apparatus along a transport path, and a supply apparatus that supplies a filling gas to be filled into the inside of the container to the inside of the container.

The container includes a flow hole forming portion in which a flow hole through which gas can flow between the outside and the inside of the container is formed.

The supply apparatus includes a connecting portion that has a flow path through which gas can flow and a filling gas supply source that allows the filling gas to flow through the flow path.

The connecting portion is configured to be switchable between a non-connected state in which the connecting portion is retracted to the outside of a moving region of the container that moves along the transport path and a connected state in which the connecting portion enters the inside of the moving region and is connected to the flow hole forming portion.

With this configuration, switching of the connecting portion from the non-connected state to the connected state allows the connecting portion that is retracted to the outside of the moving region of the container that is transported by the transport apparatus to enter the inside of the moving region, and thus, a state in which the connecting portion is connected to the flow hole forming portion of the container can be achieved. As a result, the filling gas can be supplied to the inside of the container during transportation of the container from the first apparatus to the second apparatus.

Therefore, even when it takes a long time for transportation between the first apparatus and the second apparatus, a suitable environment for maintaining the quality of the accommodated article can be maintained inside the container.

Other features and advantages of the technologies according to the present disclosure will become clearer from the following explanation of illustrative and non-limiting embodiments that will be described with reference to the drawings.

DETAILED DESCRIPTION

First Embodiment

Hereinafter, a first embodiment in which a container transport facility is applied to a semiconductor manufacturing facility will be described based on the drawings.

Figure 1:
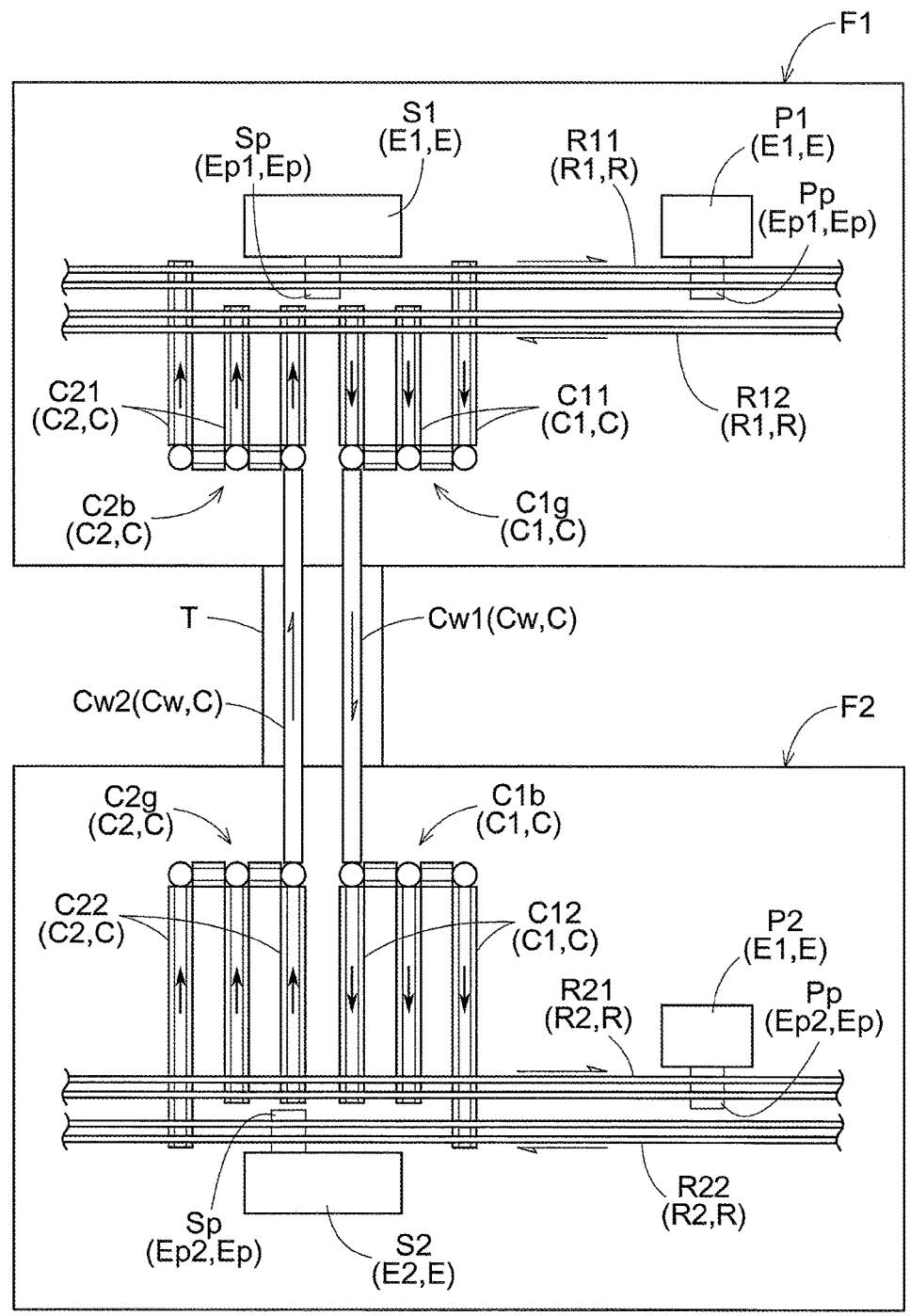
FIG. 1 is a schematic plan view of a semiconductor manufacturing facility including a container transport facility.

As shown in FIG. 1, a semiconductor manufacturing facility of the present embodiment includes a traveling rail R along which overhead transport vehicles V travel, each holding a flange Bf that is provided at an upper end of a container B (see FIGS. 2 and 3) that accommodates semiconductor wafers U, which serve as articles, and transporting the container B, and a stocker S1 and a processing apparatus P1 each of which includes a pickup/dropoff port Ep where containers B can be transferred between the stocker S1 or the processing apparatus P1 and each overhead transport vehicle V. The traveling rail R, the stocker S1, and the processing apparatus P1 are installed within a first building F1 that has a space in which a predetermined air cleanliness level is secured. Similarly, a traveling rail R, a stocker S2, and a processing apparatus P2 are installed within a second building F2 that has a space in which a predetermined air cleanliness level is secured.

The stocker S1 has a plurality of housing portions in which the containers B can be housed, and a purge portion (not shown) that supplies nitrogen gas, which serves as a filling gas, to the inside of the containers B is provided in at least one of the plurality of housing portions. Moreover, a stacker crane that transports the containers B between each of the plurality of housing portions and the pickup/dropoff port Ep (stocker pickup/dropoff port Sp) is provided within the stocker S1. The stocker S2 has the same configuration as well.

The processing apparatus P1 is, for example, an apparatus that performs photolithographic processing, cleaning, and the like of the semiconductor wafers, and, for example, is adapted to remove the semiconductor wafers from a container B that is located at the pickup/dropoff port Ep (load port Pp) and perform the processing of the semiconductor wafers. It should be noted that, in order to remove the semiconductor wafers, a detachable lid portion that is provided in a front face of the container B is detached, and then, the semiconductor wafers accommodated in the container B are removed using a suction-type robot hand or the like. Since the method and the mechanism of this operation are well-known art, descriptions thereof are omitted. The processing apparatus P2 has the same configuration as well.

It should be noted that, in the present embodiment, the stocker S1 or the processing apparatus P1, which are provided in the first building F1, corresponds to a first apparatus E1, and the stocker S2 or the processing apparatus P2, which are provided in the second building F2, corresponds to a second apparatus E2. Moreover, in the following description, when the first apparatus E1 and the second apparatus E2 are collectively described, these apparatuses are referred to as apparatuses E.

Inter-building conveyors Cw (first inter-building conveyor Cw1 and second inter-building conveyor Cw2) are provided in order to transport the containers B between the first building F1 and the second building F2. The inter-building conveyors Cw are each provided passing through the inside of an inter-building connecting tube T that connects the first building F1 and the second building F2 to each other, with one end portion in a transport direction being located within the first building F1 and the other end portion in the transport direction being located within the second building F2.

Figure 5:
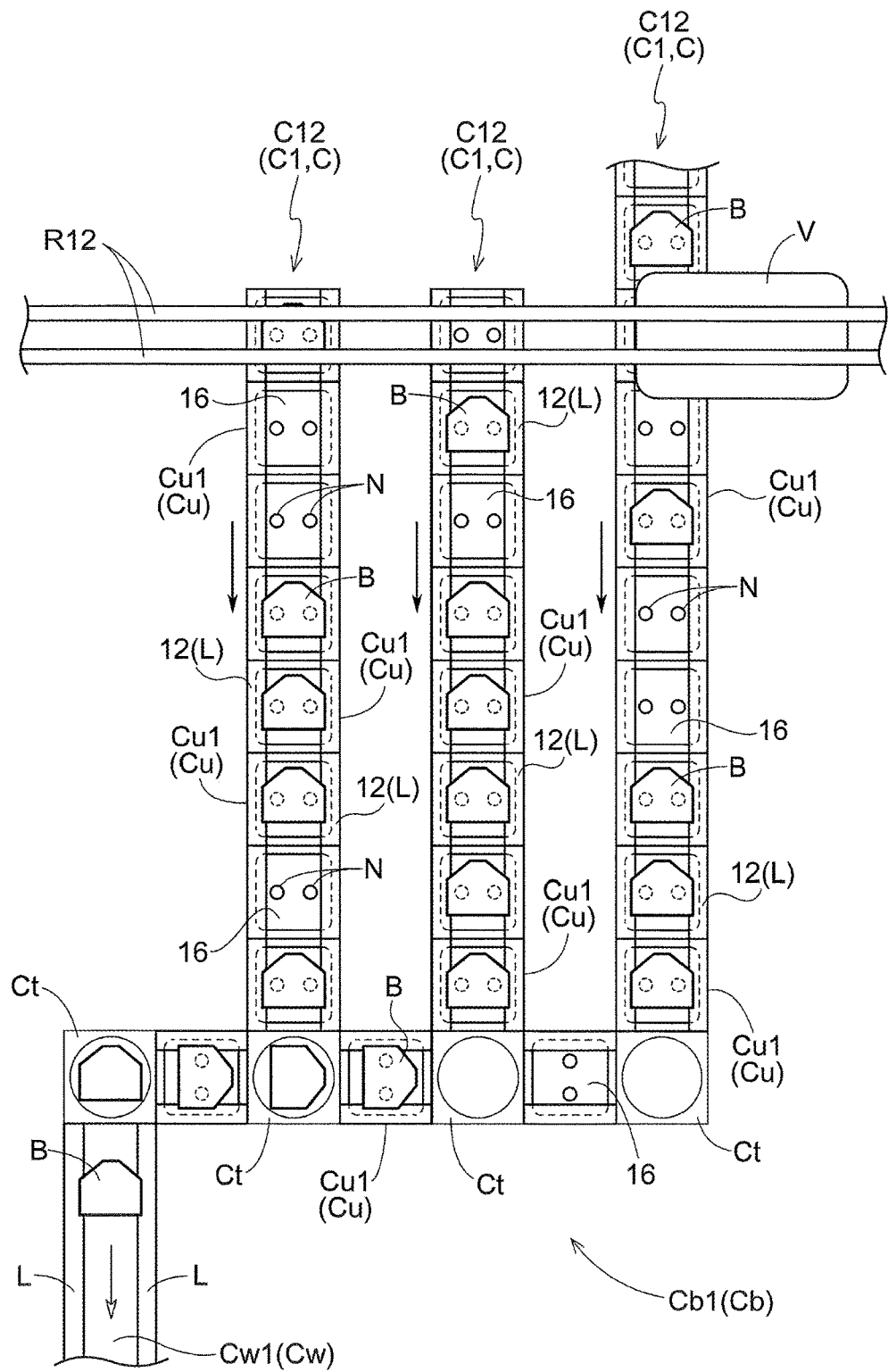
FIG. 5 is a plan view showing a merging portion that merges into an inter-building transport conveyor.
Figure 6:
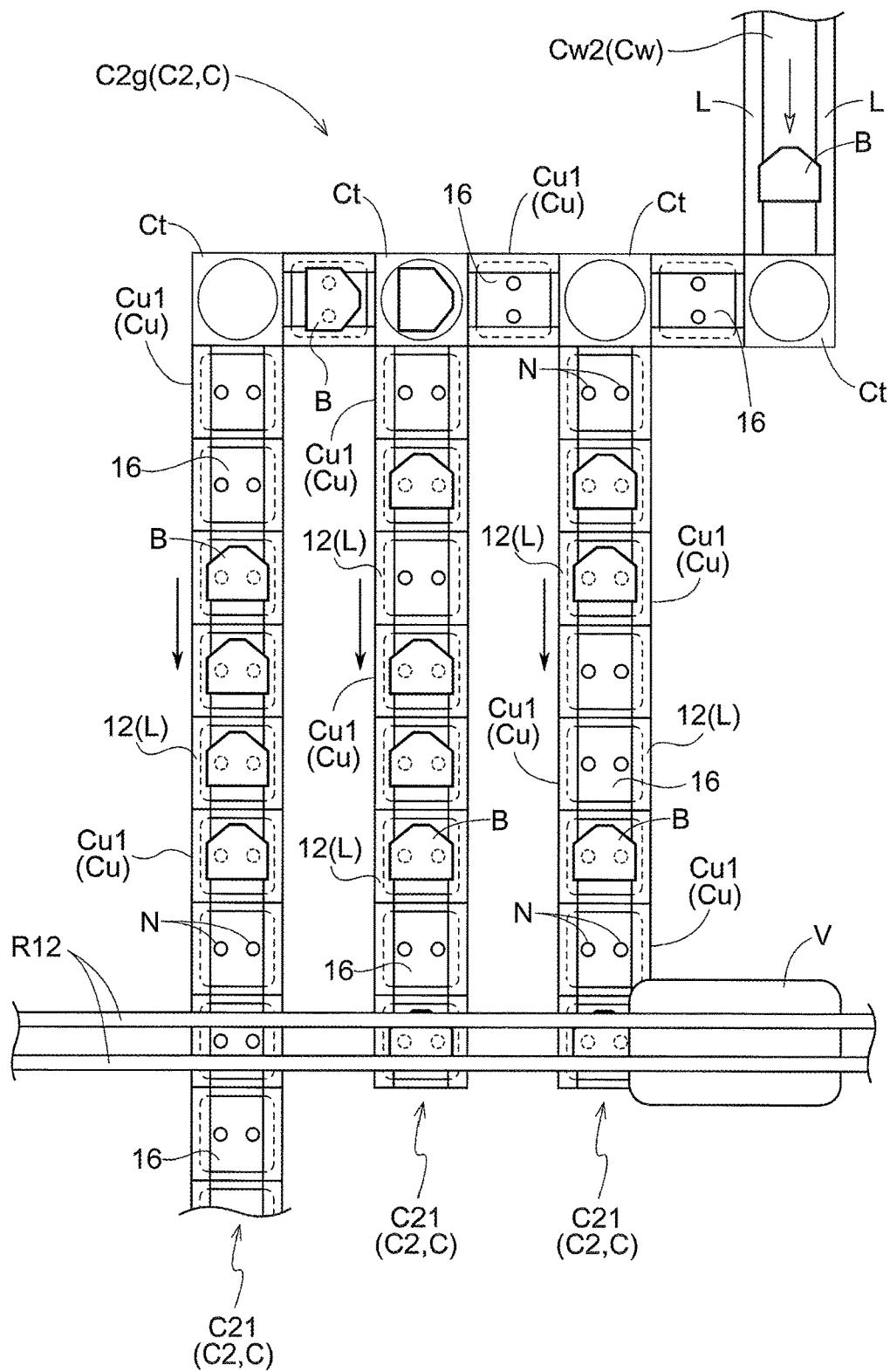
FIG. 6 is a plan view showing a branching portion that branches from an inter-building transport conveyor.

As shown in FIGS. 1 and 5, a merging conveyor C1g is connected to the end portion of the first inter-building conveyor Cw1 on the first building F1 side, and three buffer conveyors C11 are provided merging into the merging conveyor C1g. Moreover, as shown in FIGS. 1 and 6, a branching conveyor C1b is connected to the end portion of the first inter-building conveyor Cw1 on the second building F2 side, and three buffer conveyors C12 are provided branching from the branching conveyor C1b.

Similarly, a merging conveyor C2g is connected to the end portion of the second inter-building conveyor Cw2 on the second building F2 side, and three buffer conveyors C22 are provided merging into the merging conveyor C2g. Moreover, a branching conveyor C2b is connected to the end portion of the second inter-building conveyor Cw2 on the first building F1 side, and three buffer conveyors C21 are provided branching from the branching conveyor C2b.

Turntables Ct that change the direction of the containers B that are being transported in plan view are provided at merging portions or branching portions of the merging conveyors C1g and C2g and the branching conveyors C1b and C2b into or from which the buffer conveyors C11, C12, C21, and C22 merge or branch.

Figure 2:
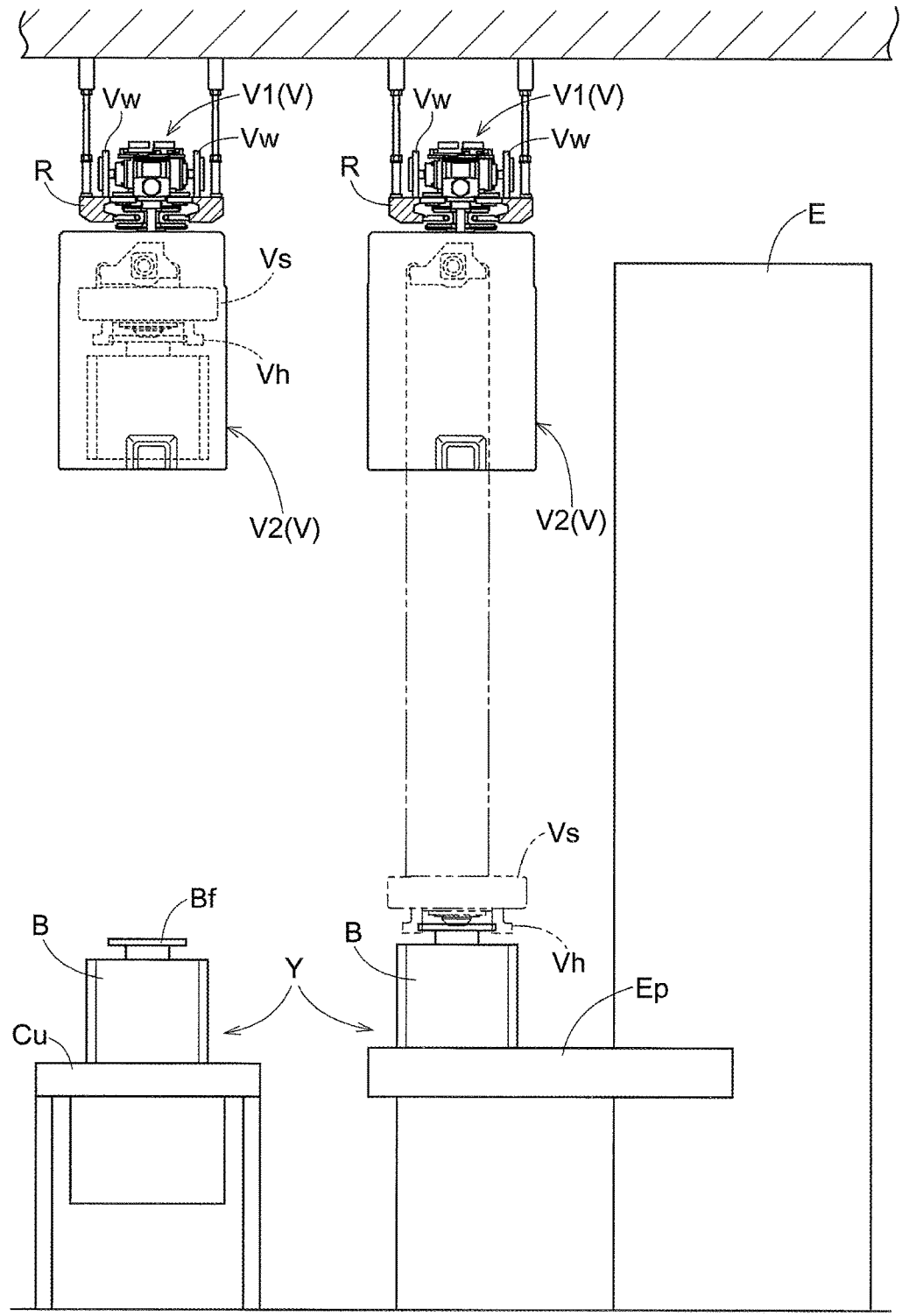
FIG. 2 is an elevational view showing a configuration of the container transport facility.

Overhead transport vehicles that travel within first building F1 along the circular traveling rail R (R11 and R12) that is supported by the ceiling of the first building F1 in a state in which it is suspended therefrom, and overhead transport vehicles that travel within the second building F2 along the circular traveling rail R (R21 and R22) that is supported by the ceiling of the second building F2 in a state in which it is suspended therefrom are provided as the overhead transport vehicles V. As shown in FIG. 2, the overhead transport vehicles V each include a traveling portion V1 including traveling wheels Vw that roll on the traveling rail R and a traveling drive portion (not shown) that drives the traveling wheels Vw, as well as a main body portion V2 that is supported under the traveling portion V1 with its distance from the traveling portion V1 in a vertical direction being fixed and that moves together with the traveling portion V1 along the traveling rail R. The main body portion V2 supports an elevation member Vs that can be lifted and lowered between a height at which a transfer location such as the pickup/dropoff port Ep, where the containers B are transferred between each apparatus E and each overhead transport vehicle V, is present and a transportation height that overlaps the main body portion V2 when viewed in the longitudinal direction of the traveling rail R. The overhead transport vehicles V are each adapted to keep the elevation member Vs at the transportation height when transporting a container B and to lower the elevation member Vs at a position where the elevation member Vs overlaps a transfer location Y in plan view so as to transfer the container B between the overhead transport vehicle V and the transfer location Y. Moreover, the elevation member Vs is equipped with a holding portion Vh that holds the flange Bf of the container B.

With respect to two of the three buffer conveyors C11 and two of the three buffer conveyors C21, respective transport end portions serve as the transfer locations for the overhead transport vehicles V that travel along the traveling rail R12. Moreover, with respect to the other one of the three buffer conveyors C11 and the other one of the three buffer conveyors C21, respective transport end portions serve as the transfer locations for the overhead transport vehicles V that travel along the traveling rail R11.

Similarly, with respect to two of the three buffer conveyors C12 and two of the three buffer conveyors C22, respective transport end portions serve as the transfer locations for the overhead transport vehicles V that travel along the traveling rail R21. Moreover, with respect to the other one of the three buffer conveyors C11 and the other one of the three buffer conveyors C21, respective transport end portions serve as the transfer locations for the overhead transport vehicles V that travel along the traveling rail R22.

Figure 3:
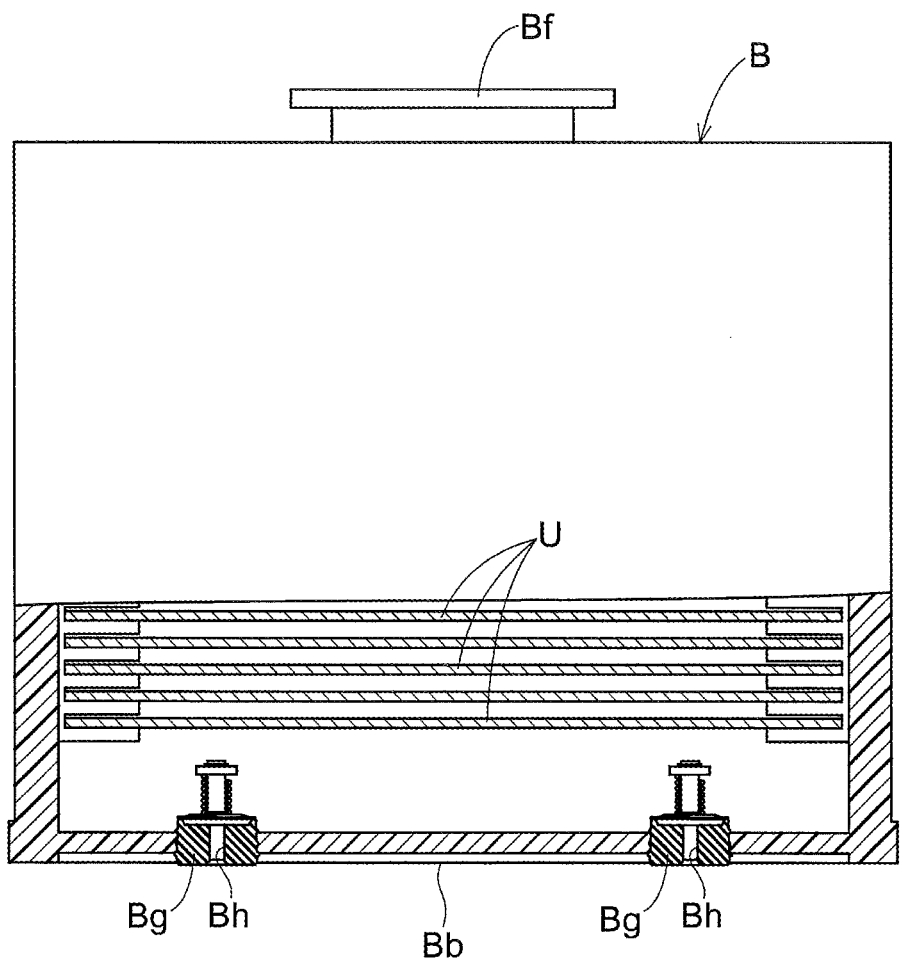
FIG. 3 is a partially cutaway front view of a semiconductor transport container.

Here, the containers B, which are transport objects of the present embodiment, will be described based on FIG. 3.

Each container B is a container, called a FOUP or a FOSB, for example, in which a plurality of semiconductor wafers U can be accommodated spaced apart from one another in a height direction. This container B includes a detachable lid in its front face, and the lid is mounted thereto when loading/unloading of the semiconductor wafers U is not performed. The lid is configured to be able to secure airtightness. Moreover, two flow hole forming portions Bg in each of which a flow hole Bh through which gas can flow between the outside and the inside of the container B is formed are provided in a bottom portion Bb of the container B. The flow hole forming portions Bg are each configured to allow a nozzle N (see FIG. 4) of an inert gas supply portion, which is described later, to be connected thereto. That is to say, the container B includes the flow hole forming portions Bg in which the flow holes Bh, through which gas can flow between the outside and the inside of the container B, are formed.

Each flow hole forming portion Bg includes an on-off valve mechanism that is open when the nozzle N is connected and that is closed when the nozzle N is disconnected. Also, a configuration is adopted in which the inside of the container B is filled with an inert gas (e.g., nitrogen gas or the like), which serves as the filling gas, by injecting the inert gas from the nozzle N in a state in which the nozzle N is connected to the flow hole forming portion Bg of the container B.

In the present embodiment, as shown in FIGS. 5 and 6, the buffer conveyors C11, C12, C21, and C22, the branching conveyors C1b and C2b, and the merging conveyors C1g and C2g are each configured by lining up a plurality of conveyor units Cu in the transport direction in plan view, the conveyor units Cu each being formed to have a length less than twice the length of each container B in the transport direction. That is to say, in the present embodiment, a plurality of nozzles N are provided distributed along a transport path.

In the following description, when the above-described buffer conveyors C11, C12, C21, and C22, branching conveyors C1b and C2b, merging conveyors C1g and C2g, and inter-building conveyors Cw are collectively described, these conveyors may be referred to as conveyors C. In the present embodiment, a transport apparatus is constituted by the conveyors C and the above-described overhead transport vehicles V. That is to say, the first apparatus E1 that includes the pickup portion Ep1 at which the containers B accommodating the semiconductor wafers U are picked up, the second apparatus E2 that includes the dropoff portion Ep2 at which the containers B are dropped off, and the transport apparatus (conveyors C and overhead transport vehicles V) that transports the containers B from the first apparatus E1 to the second apparatus E2 along the transport path are provided.

It should be noted that although a configuration in which the first apparatus E1 includes the pickup portion Ep1, the second apparatus E2 includes the dropoff portion Ep2, and the transport apparatus transports the containers B from the first apparatus E1 to the second apparatus E2 is described in this embodiment by way of example, a configuration may also be adopted in which the second apparatus E2 includes a pickup portion, the first apparatus E1 includes a dropoff portion, and the transport apparatus transports the containers B from the second apparatus E2 to the first apparatus E1.

Figure 4:
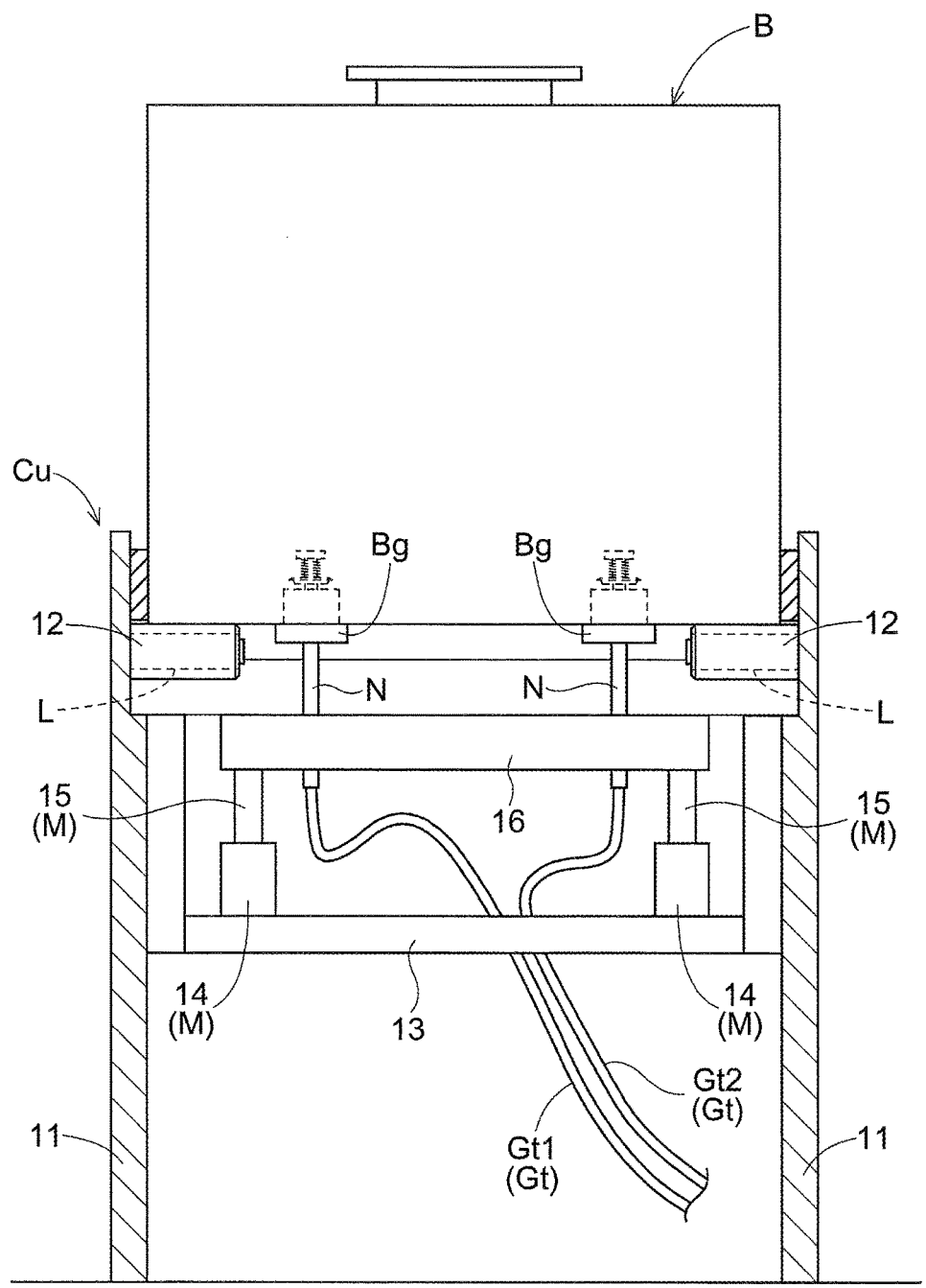
FIG. 4 is a front view showing a conveyor unit of a first embodiment.

The conveyor units Cu (hereinafter, described as conveyor units Cu1 when the description is directed to only the conveyor units Cu of the present embodiment) of the first embodiment each include, as shown in FIG. 4, base portions 11 which are attached to a floor portion and thus the positions of which in the direction along the transport path are fixed, rollers 12 that are rotatably fixed to the respective base portions 11, a cylinder support portion 13 that is fixed to the base portions 11, cylinders M that are fixed to the cylinder support portion 13, and a nozzle support member 16 that supports the nozzles N of the inert gas supply portion. The cylinders M are each constituted by a cylinder main body 14 that is attached to the cylinder support portion 13 and a cylinder rod 15 that is supported by the cylinder main body 14 in such a manner as to be extendable or retractable in the vertical direction, and the cylinder rod 15 is moved up and down electromagnetically or by using a driving force such as gas pressure. Moreover, the nozzle support member 16 is attached to upper ends of the cylinder rods 15, and is moved up and down in accordance with the movement of the cylinder rods 15. The nozzles N are supported by the nozzle support member 16 in a state in which their positions relative to the nozzle support member 16 are fixed, and the nozzles N are moved up and down in the vertical direction in accordance with the movement of the cylinder rods 15.

The nozzles N are configured to be switchable between a connected state and a non-connected state through extension and contraction of the cylinder rods 15 of the above-described cylinders M. Here, the connected state refers to a state in which the nozzles N are connected to the flow hole forming portions Bg of the container B. As a result of the cylinder rods 15 protruding and pushing up the nozzle support member 16 and the nozzles N, the nozzles N are moved close to a moving region side of the container B that moves along the transport path. Then, when leading ends of the nozzles N advance into and are fitted in the flow holes Bh formed in the respective flow hole forming portions Bg, the connected state is achieved. In this connected state, the nozzles N fitted in the flow holes Bh enter the inside of the moving region of the container B that moves along the transport path and are connected to the flow hole forming portions Bg of the container B.

The non-connected state refers to a state in which the nozzles N are not connected to the flow hole forming portions Bg of the container B. As a result of the cylinder rods 15 being withdrawn and moving the nozzle support member 16 and the nozzles N downward, the nozzles N are removed from the flow hole forming portions Bg of the container B, and thus the non-connected state is achieved. In this non-connected state, the nozzles N are retracted to the outside of the moving region of the container B that moves along the transport path. According to the present embodiment, in the non-connected state, the nozzles N are retracted into a lower region that is located below the moving region of the container B.

The rollers 12 are configured to be driven by roller driving motors L which are fixed to the respective base portions 11 and thus the positions of which relative to the base portions 11 in the direction along the transport path are fixed. As a result of driving the roller driving motors L in a state in which the rollers 12 are in contact with the bottom portion Bb of the container B, a propulsive force along the transport path is applied to the container B. The rollers 22 are provided lined up along the entire length of the individual conveyor units Cu in the transport direction.

In the present embodiment, the transport apparatus includes the conveyor units Cu of the conveyors C, the base portion 11 corresponds to a base portion, the roller driving motors L correspond to a driving portion, and the rollers 12 correspond to a contact portion. That is to say, the conveyor units Cu1 each include the base portions 11 whose positions in the direction along the transport path are fixed, the roller driving motors L that are supported by the respective base portions 11 in a state in which their positions relative to the base portions 11 in the direction along the transport path are fixed, and the rollers 12 that are driven by the roller driving motors L while being in contact with the container B and transmit a propulsive force in the direction along the transport path to the container B, and the rollers 12 constitute rotating members that are rotatably supported by the base portions 11 and that are rotated by the roller driving motors L.

As shown in FIG. 4, flow tubes Gt through which the inert gas from the inert gas supply portion is supplied to the above-described nozzles N are connected to the nozzles N. The flow tubes Gt are formed of a flexible material (such as rubber or silicone resin). It should be noted that two nozzles N are provided in each one of the conveyor units Cu, a first flow tube Gt1 serving as the flow tube Gt is connected to one of the two nozzles N, and a second flow tube Gt2 serving as the flow tube Gt is connected to the other of the two nozzles N.

A gas supply source G is connected to the first flow tube Gt1, and the inert gas is sent out from the gas supply source G toward the nozzle N. On the other hand, an exhaust pump is connected to an end portion of the second flow tube Gt2 that is located on the far side from the nozzle N, and the gas inside the container B is sucked and exhausted out by the exhaust pump. Thus, the gas inside the container B can be quickly replaced with the inert gas.

Moreover, a detection sensor J (see FIG. 7) that detects the concentration of the inert gas is provided between the second flow tube Gt2 and the exhaust pump. The detection sensor J is adapted to detect the concentration of the inert gas in the gas within the container B that has been discharged from the container B via the second flow tube Gt2. In the present embodiment, the detection sensor J corresponds to a detector. That is to say, a detection sensor J that detects the state of the inert gas within the container B is provided.

Furthermore, a supply switching valve K that can be opened and closed is provided between the first flow tube Gt1 and the gas supply source G. The gas supply source G continuously keeps the inert gas at a positive pressure. The inert gas is sent out to the first flow tube Gt1 by opening the supply switching valve K, and sending out of the inert gas to the first flow tube Gt1 is stopped by closing the supply switching valve K.

In the present embodiment, the nozzles N correspond to a connecting portion, and the gas supply source G and the supply switching valve K correspond to a filling gas supply source. Moreover, a flow path is mainly formed in the first flow tube Gt1. A supply apparatus includes the above-described nozzles N and the gas supply source G. That is to say, the supply apparatus includes the nozzles N having the flow path through which gas can flow and the filling gas supply source (gas supply source G and supply switching valve K) that allows the inert gas to flow through the flow path, and is configured to be switchable between a supplying state in which the filling gas supply source allows the inert gas to flow through the first flow tube Gt1 and a supply-stopped state in which the filling gas supply source does not allow the inert gas to flow through the first flow tube Gt1.

It should be noted that in the present embodiment, only one pair (hereinafter referred to as a unit supply portion) of nozzles N that are supported by the above-described nozzle support member 16 are provided in each one of the conveyor units Cu1.

Figure 7:
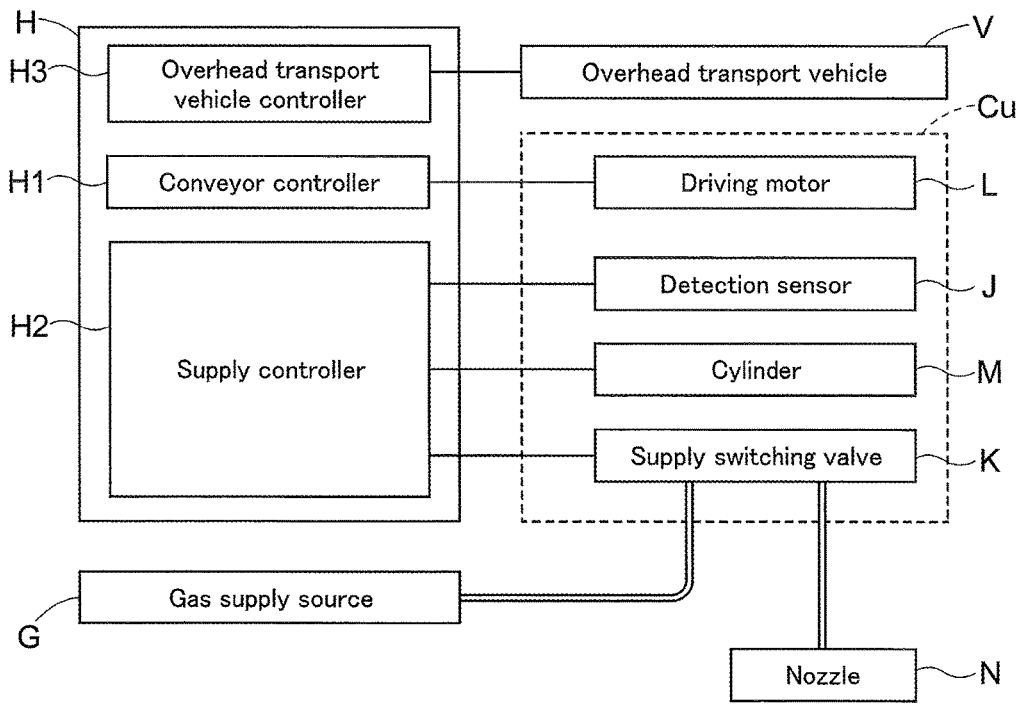
FIG. 7 is a control block diagram.

FIG. 7 is a block diagram for explaining a control configuration of the semiconductor manufacturing facility of the present embodiment. A controller H is configured by a single computer, such as a client computer or a server computer, including an arithmetic unit and a storage, for example.

The controller H includes a conveyor controller H1 that controls the operation of the conveyors C, a supply controller H2 that controls the operation of the inert gas supply portion, and an overhead transport vehicle controller H3 that controls traveling of the overhead transport vehicles V in the form of programs. It should be noted that in the present embodiment, the controller H is configured by a single computer, and the single computer executes the programs respectively constituting the conveyor controller H1, the supply controller H2, and the overhead transport vehicle controller H3; however, it is also possible for separate computers to execute the programs constituting the conveyor controller H1, the supply controller H2, and the overhead transport vehicle controller H3, respectively. In this case, the computers are connected to one another in such a manner as to be able to communicate with one another via a wired or wireless LAN or the like.

The conveyor controller H1 is configured to control the operation of the roller driving motors L of the conveyor units Cu. Each of the conveyor units Cu is provided with a load presence detector (not shown) that detects whether or not a container B is present. The load presence detectors of the conveyor units Cu are each configured to send information regarding whether or not a container B is present on the corresponding conveyor unit Cu to the conveyor controller H1.

In the present embodiment, the conveyor controller H1 corresponds to a transport controller, and the transport apparatus includes the above-described conveyor units Cu and the conveyor controller H1. That is to say, the transport apparatus includes the conveyor controller H1 that controls the roller driving motors L.

Moreover, a configuration is adopted in which the result of detection by the detection sensor J is input to the supply controller H2, and the supply controller H2 is adapted to control extension/contraction of the cylinder rods 15 of the cylinders M and opening/closing of the supply switching valve K. The supply controller H2 is adapted to control switching of the nozzles N between the connected state and the non-connected state and switching of the filling gas supply source between the supplying state and the supply-stopped state.

Moreover, the supply controller H2 is configured to determine whether the state of the inert gas within a container B that has been detected by a certain detection sensor J is a supply-required state in which supply of the inert gas to the container B is required or a supply-non-required state in which supply of the inert gas to the container B is not required, switch the nozzles N to the connected state and the filling gas supply source to the supplying state if the state of the inert gas is determined as being the supply-required state, and switch the filling gas supply source to the supply-stopped state if the state of the inert gas is determined as being the supply-non-required state.

It should be noted that switching the nozzles N to the connected state includes both switching the nozzles N to the connected state, in the case where the nozzles N have been in the non-connected state until then, and maintaining the connected state, in the case where the nozzles N are already in the connected state. Moreover, switching the filling gas supply source to the supplying state includes both switching the filling gas supply source to the supplying state, in the case where the filling gas supply source has been in the supply-stopped state until then, and maintaining the supplying state, in the case where the filling gas supply source is already in the supplying state. Similarly, switching the filling gas supply source to the supply-stopped state includes both switching the filling gas supply source to the supply-stopped state, in the case where the filling gas supply source has been in the supplying state until then, and maintaining the supply-stopped state, in the case where the filling gas supply source is already in the supply-stopped state. That is to say, the supply controller H2 is configured to switch the nozzles N to the connected state or maintain the connected state and switch the filling gas supply source to the supplying state or maintain the supplying state if the state of the inert gas is determined as being the supply-required state, and switch the filling gas supply source to the supply-stopped state or maintain the supply-stopped state if the state of the inert gas is determined as being the supply-non-required state.

The overhead transport vehicle controller H3 is adapted to control traveling of the traveling portions V1 of the overhead transport vehicles V, lifting/lowering of the elevation members Vs of the main body portions V2, and the holding operation of the holding portions Vh that are fitted to the elevation members Vs.

Specifically, based on instructions from a superordinate management apparatus (not shown), the overhead transport vehicle controller H3 causes a relevant overhead transport vehicle V to travel to a traveling position corresponding to the pickup portion Ep1 of the first apparatus E1 serving as a transport source, and, at that traveling position, lowers the elevation member Vs to the height corresponding to the pickup/dropoff port Ep and causes the holding portion Vh to hold the flange Bf of a container B. After that, in a state in which the holding portion Vh holds the flange Bf of the container B, the overhead transport vehicle controller H3 lifts the elevation member Vs to the transportation height and causes the overhead transport vehicle V to travel to a position corresponding to a relevant buffer conveyor C11 serving as a transport destination. Then, the overhead transport vehicle controller H3 lowers the elevation member Vs at that position and causes the container B to be placed on the buffer conveyor C11.

If the apparatus E serving as the transport destination is present in a different building (second building F2 in the above-described case), the container B is transported via the buffer conveyor C11, the merging conveyor C1g, the first inter-building conveyor Cw1, the branching conveyor C1b, and a relevant buffer conveyor C12 in this order. Conversely, if the apparatus E serving as the transport source is present in the second building F2, and the apparatus E serving as the transport destination is present in the first building F1, the container B is transported via a relevant buffer conveyor C22, the merging conveyor C2g, the second inter-building conveyor Cw2, the branching conveyor C2b, and a relevant buffer conveyor C21 in this order.

It should be noted that although a case in which the apparatus E serving as the transport source and the apparatus E serving as the transport destination are present in different buildings is described here, it is also possible for the apparatus E serving as the transport source and the apparatus E serving as the transport destination to be present in the same building.

Figure 8:
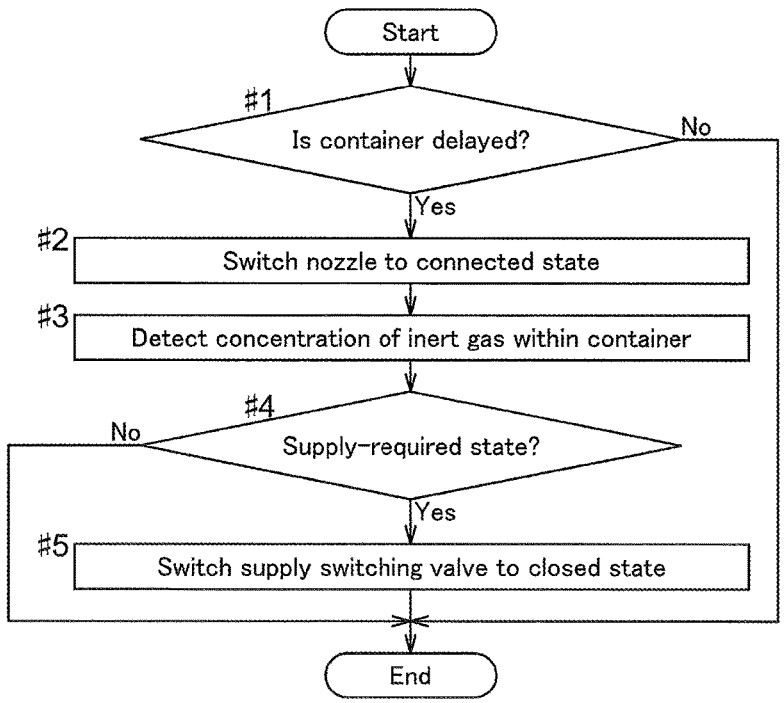
FIG. 8 is a flowchart.

Next, the form of control of the container transport facility of the present embodiment will be described based on the flowchart in FIG. 8. The conveyor controller H1 determines whether or not a container B is delayed at a certain conveyor unit Cu based on detection information from the load presence detector (step #1). Here, "a container B is delayed" refers to a state in which the same container B is supported by the same conveyor unit Cu for a predetermined period of time (e.g., 30 seconds) or longer.

If the conveyor controller H1 determines that a container B is delayed (step #1: Yes), the conveyor controller H1 notifies the supply controller H2 to that effect. The supply controller H2 switches the nozzles N to the connected state by lifting the nozzles N through the operation of the cylinders M (step #2), detects the concentration of the inert gas in the gas within the container B that has been discharged from the container B via the second flow tube Gt2 using the detection sensor J (step #3), and determines whether the state of the inert gas within the container that has been detected by the detection sensor J is the supply-required state, in which supply of the inert gas to the container B is required, or the supply-non-required state, in which supply of the inert gas to the container B is not required (step #4). If the state of the inert gas is determined as being the supply-required state (step #4: Yes), the supply controller 112 opens the supply switching valve K (step #5) and supplies the inert gas to the container B. At that time, according to the present embodiment, the exhaust pump that is connected to the second flow tube Gt2 is activated.

It should be noted that if the supply controller 112 determines that the container B is not delayed (step #1: No) or if the state of the inert gas is determined as being the supply-non-required state (step #4: No), control according to this flow is ended. The controller H executes the above-described control for each conveyor unit Cu, and if control according to the flowchart is ended, the controller H executes the above-described control again after a predetermined period of time (e.g., 1 second) has elapsed.

According to the present embodiment, the above-described configuration and control make it possible to suppress, even if a container B is delayed midway along the transport path via the conveyors C, and transport of that container B from the first apparatus E1 to the second apparatus E2 takes a prolonged period of time, a decrease in the concentration of the inert gas inside the container B and resulting contamination and deterioration of the semiconductor wafers U accommodated in the container B.

Second Embodiment

Next, a second embodiment in which the container transport facility of the present invention is applied to a semiconductor manufacturing facility will be described based on FIGS. 9 and 10. However, the second embodiment has the same configuration as the first embodiment except that the form of the conveyor units Cu is different, and therefore, in the following description, only the conveyor units Cu having a configuration that is different from the configuration of those of the first embodiment will be described.

Figure 9:
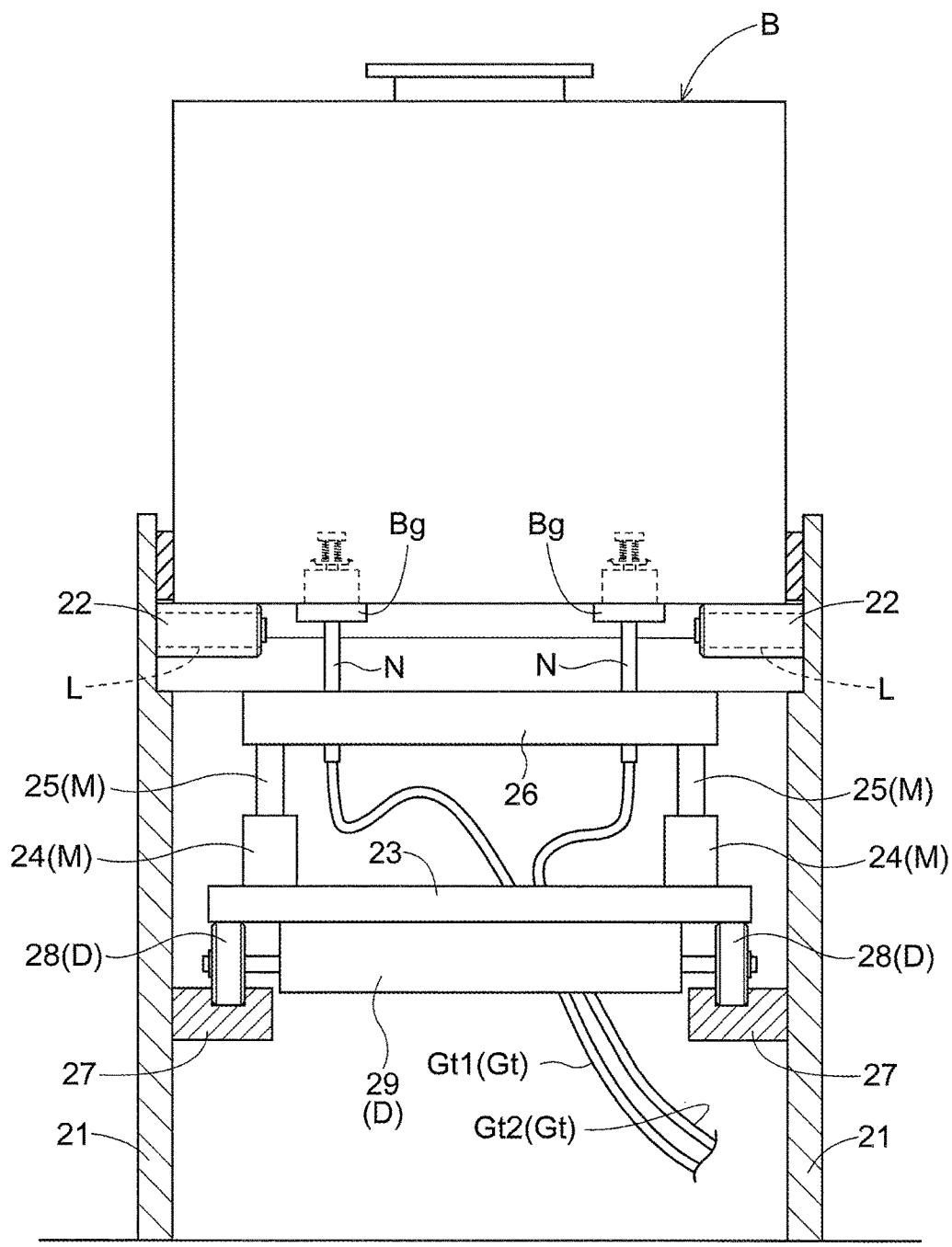
FIG. 9 is a front view showing a conveyor unit of a second embodiment.

As shown in FIG. 9, the conveyor units Cu (conveyor units Cu2) of the second embodiment each include base portions 21 which are attached to the floor portion and thus the positions of which in the direction along the transport path are fixed, rollers 22 that are rotatably fixed to the respective base portions 21, a cylinder support portion 23 that is fixed to the base portions 21, cylinders M that are fixed to the cylinder support portion 23, and a nozzle support member 26 that supports the nozzles N of the inert gas supply portion. Each cylinder M is constituted by a cylinder main body 24 that is attached to the cylinder support portion 23 and a cylinder rod 25 that is supported by the cylinder main body 24 in such a manner as to be extendable or retractable in the vertical direction, and the cylinder rods 25 are moved up and down electromagnetically or by using a driving force such as gas pressure. Moreover, the nozzle support member 26 is attached to upper ends of the cylinder rods 25 and is moved up and down in accordance with the movement of the cylinder rods 25. The nozzles N are supported by the nozzle support member 26 with their positions relative to the nozzle support member 26 being fixed, and thus, the nozzles N are moved in the vertical direction in accordance with the movement of the cylinder rods 25.

The nozzles N are configured to be switchable between the non-connected state in which the nozzles N are retracted to the outside of the moving region of each container B that moves along the transport path and the connected state in which the nozzles N enter the inside of the moving region and are connected to the respective flow hole forming portions Bg of the container B, through extension/contraction of the cylinder rods 25 of the above-described cylinders M.

The rollers 22 are adapted to be driven by the roller driving motors L which are fixed to the respective base portions 21 and thus the positions of which relative to the base portions 21 in the direction along the transport path are fixed. As a result of driving the roller driving motors L in a state in which the rollers 22 are in contact with the bottom portion Bb of the container B, a propulsive force along the transport path is applied to the container B.

Figure 10:
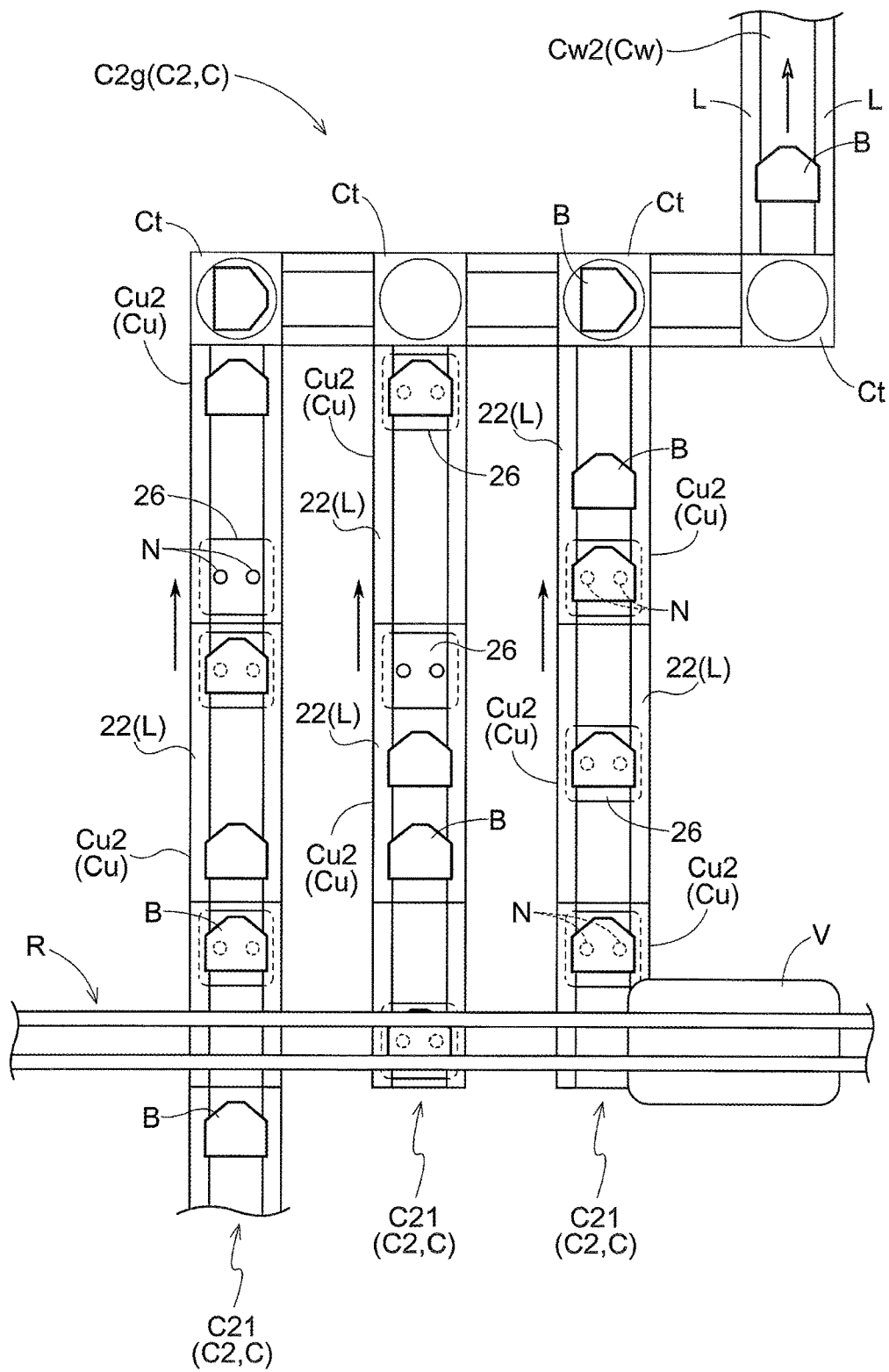
FIG. 10 is a plan view of a merging portion including a conveyor unit of the second embodiment.

Moreover, with respect to the conveyor units Cu2 of the present embodiment, as shown in FIG. 10, the length of a single unit in the transport direction is set to be twice or more (e.g., about five times) the length of each container B in the transport direction. The rollers 22 are provided lined up along the entire length of the individual conveyor units Cu2 in the transport direction.

A wheel driving motor 29 that rotates traveling wheels 28 are provided at a lower portion of the cylinder support portion 23. Traveling rails 27 that support the respective traveling wheels 28 in a rollable manner are attached to the respective base portions 21 along the transport path.

The wheel driving motor 29 is controlled by the conveyor controller H1 such that the wheel driving motor 29 moves the cylinder support portion 23 in synchronization with movement of the container B that is moved by the rollers 22. Accordingly, as shown in FIG. 9, while a container B is moving, the inert gas can be supplied to that container B.

In the present embodiment, a connecting portion moving mechanism D includes the traveling wheels 28 and the wheel driving motor 29. That is to say, a connecting portion moving mechanism D that moves the nozzles N along the transport path in synchronization with movement of a container B that is transported by the transport apparatus in the direction along the transport path is provided.

The connecting portion moving mechanism D is configured to be controlled by the conveyor controller H1 such that, based on the amount of movement of the container B that is calculated based on the amount of rotation of the roller driving motors L that are controlled by the conveyor controller H1 or the amount of rotation of the rollers 22, the connecting portion moving mechanism D is moved following the container B for the same amount of movement as that of the container B.

With this configuration, even when a container B is moving along the transport path, the inert gas can be supplied to the inside of that container B.

OTHER EMBODIMENTS (1) In the foregoing first and second embodiments, a configuration is adopted in which the stockers S1 and S2 and the processing apparatuses P1 and P2 are provided as the first apparatus and the second apparatus. However, a configuration may also be adopted in which only stockers or only processing apparatuses are provided as the first apparatus and the second apparatus. Moreover, in the foregoing first and second embodiments, apparatuses that perform photolithographic processing and cleaning are described as examples of the processing apparatuses P1 and P2. However, the present invention may also be applied to apparatuses that perform processes other than those described above, for example, various types of processing including development processing and sputtering.

(2) In the foregoing first and second embodiments, the conveyors including the driving portions that are supported by the base portions with their positions relative to the base portions in the direction along the transport path being fixed are described as the transport apparatus by way of example. However, the present invention is not limited to this configuration. For example, a configuration may also be adopted in which a traveling rail is provided as the base portion, an overhead transport vehicle that can travel along the traveling rail is provided, and a holding portion that holds a container is provided in the overhead transport vehicle as the contact portion.

(3) Although semiconductor wafers are described as an example of the accommodated article, and a FOUP and a FOSB are described as examples of the containers, the accommodated article may also be an article (e.g., reticle, glass substrate, or the like) other than semiconductor wafers. The accommodated article may also be food, an agricultural product, or the like. In this case, gas for food, such as nitrogen, carbonic acid gas, oxygen, low-temperature gas, and the like, for suppressing a decrease in the quality of food or an agricultural product within the containers is used as the filling gas.

(4) In the foregoing first and second embodiments, a configuration in which the rollers 12 that are rotatably supported by the base portions 11 and that are rotated by the roller driving motors L are used as the rotating member is described. However, instead of this configuration, a wound member such as a belt or a chain that is in contact with the bottom portion Bb of the container B may be used as the rotating member. In this case, a configuration is conceivable in which a motor or the like that causes a portion of the wound member that extends along the transport path to move along the transport path is used as the driving portion. Moreover, in the foregoing embodiments, a configuration in which the rotating member is used as the contact portion is described by way of example; however, for example, a support member that is supported by the base portions 11 in such a manner as to be movable along the transport path and that is moved by the driving portion may also be used. As an example of this support member, for example, a configuration is conceivable in which a plurality of electromagnets that can be individually turned ON/OFF are fixed to the base portions 11 along the transport path, a magnetic substance is attached to a portion of the support member (supporting carriage or the like) that is located within a range of the effect of magnetic force of the electromagnets, the support member being able to move relative to the base portions 11 in the direction along the transport path, and a propulsive force is transmitted by turning ON the electromagnets sequentially in the transport direction and thereby moving an attraction exerted portion of the magnetic substance attached to the support member in the transport direction.

Figure 11:
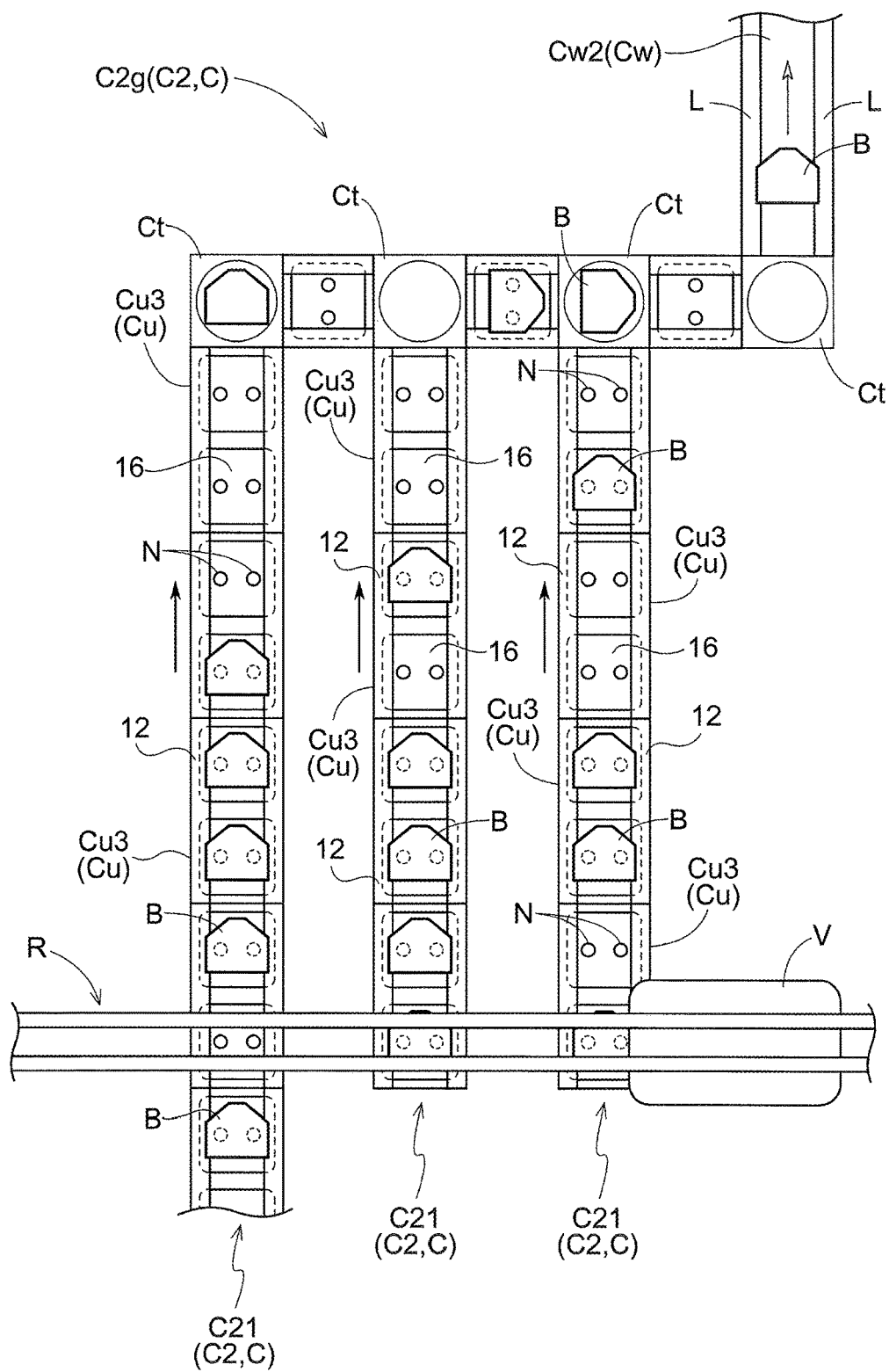
FIG. 11 is a plan view of a merging portion including a conveyor unit of another embodiment.

(5) In the foregoing first embodiment, a configuration in which only one unit supply portion is provided in each one of the conveyor units Cu1 is described by way of example. However, the present invention is not limited to this configuration. For example, as shown in FIG. 11, a configuration in which two unit supply portions are provided in each one of the conveyor units Cu (conveyor units Cu3) or a configuration in which three or more unit supply portions are provided in each one of the conveyor units Cu may also be adopted.

(6) In the foregoing first and second embodiments, a configuration in which the detection sensor J that detects the concentration of the inert gas in the gas within each container B is provided as the detector. However, the present invention is not limited to this configuration. For example, a configuration may also be adopted in which, on the assumption that there is a correlation between the concentration of the inert gas and time that has elapsed after the supply of the inert gas, a state inferring portion is provided as the detector, the state inferring portion including a database in which the time at which the inert gas was last supplied to a container B is recorded, and inferring the state of the inert gas within the container B based on an elapsed time after the time that is recorded in the database. In this case, the term "detection" includes determination of the state of the inert gas that has been inferred through calculations on a computer or the like. In this case, the supply controller H2 can maintain the nozzles N in the non-connected state until the state of the inert gas is determined as being the supply-required state based on the state of the gas that has been inferred by the above-described state inferring portion. Then, when the supply controller H2 determines the state of the inert gas as being the supply-required state, the supply controller H2 switches the nozzles N to the connected state.

(7) In the foregoing first and second embodiments, a configuration in which the plurality of nozzles N are provided distributed along the transport path is described. However, a configuration in which a single nozzle N is provided along the transport path may also be adopted.

Overview of Embodiments

A container transport facility of an embodiment of the present invention includes a first apparatus including a pickup portion at which a container that accommodates an article is picked up, a second apparatus including a dropoff portion at which the container is dropped off, a transport apparatus that transports the container from the first apparatus to the second apparatus along a transport path, and a supply apparatus that supplies a filling gas to be filled into the inside of the container to the inside of the container, wherein the container includes a flow hole forming portion in which a flow hole through which gas can flow between the outside and the inside of the container is formed, the supply apparatus includes a connecting portion that has a flow path through which gas can flow and a filling gas supply source that allows the filling gas to flow through the flow path, and the connecting portion is configured to be switchable between a non-connected state in which the connecting portion is retracted to the outside of a moving region of the container that moves along the transport path and a connected state in which the connecting portion enters the inside of the moving region and is connected to the flow hole forming portion.

With this configuration, switching of the connecting portion from the non-connected state to the connected state allows the connecting portion that is retracted to the outside of the moving region of the container that is transported by the transport apparatus to advance into the moving region, and thus, a state in which the connecting portion is connected to the flow hole forming portion of the container can be achieved. As a result, the filling gas can be supplied to the inside of the container during transportation of the container from the first apparatus to the second apparatus.

Therefore, even when it takes a long time for transportation between the first apparatus and the second apparatus, a suitable environment for maintaining the quality of the accommodated article can be maintained inside the container.

According to an embodiment, it is preferable that the filling gas supply source is configured to be switchable between a supplying state in which the filling gas supply source allows the filling gas to flow through the flow path and a supply-stopped state in which the filling gas supply source does not allow the filling gas to flow through the flow path, a supply controller that controls switching of the connecting portion between the connected state and the non-connected state and switching of the filling gas supply source between the supplying state and the supply-stopped state, and a detector that detects a state of the filling gas within the container are provided, and the supply controller is configured to determine whether the state of the filling gas within the container that has been detected by the detector is a supply-required state in which supply of the filling gas to the container is required or a supply-non-required state in which supply of the filling gas to the container is not required, switch the connecting portion to the connected state and the filling gas supply source to the supplying state if the state of the filling gas is determined as being the supply-required state, and switch the filling gas supply source to the supply-stopped state if the state of the filling gas is determined as being the supply-non-required state.

With this configuration, if the state of the filling gas that has been detected by the detector is determined as being the supply-non-required state, in which supply of the filling gas to the container is not required, the filling gas supply source is switched to the supply-stopped state. Therefore, when the state within the container is the supply-non-required state, in which supply of the filling gas is not required, the filling gas can be prevented from being supplied to the container, and thus the filling gas can be saved.

According to an embodiment, it is preferable that the transport apparatus includes a base portion whose position in a direction along the transport path is fixed, a driving portion that is supported by the base portion with its position relative to the base portion in the direction along the transport path being fixed, a contact portion that is driven by the driving portion while being in contact with the container and transmits a propulsive force in the direction along the transport path to the container, and a transport controller that controls the driving portion, the contact portion is either one of a rotating member that is rotatably supported by the base portion and that is rotated by the driving portion and a support member that is supported by the base portion in such a manner as to be movable along the transport path and that is moved by the driving portion, and the supply controller switches the connecting portion to the non-connected state and the filling gas supply source to the supply-stopped state if the driving portion is driven by the transport controller.

With this configuration, in the transport apparatus, which transports the container in such a manner that the contact portion applies a propulsive force to the container that is in contact with the contact portion, while the contact portion is driven by the driving portion, and the container is moved, the connecting portion can be switched to the non-connected state and the filling gas supply source to the supply-stopped state.

It should be noted that as specific examples of the above-described transport apparatus, a transport apparatus that includes, as the rotating member, a transport roller or a wound member, such as a belt or a chain, and a transport apparatus that includes, as the support member, a transport platform that moves in the transport direction in a state in which the container is placed on and supported by the transport platform are conceivable.

In such a transport apparatus, it is possible to switch the connecting portion to the non-connected state in a state in which the container is moving and to switch the connecting portion to the connected state in a state in which the container is stopped, so that the filling gas can be supplied to the container midway along the transport path from the first apparatus to the second apparatus, without interfering with the movement of the container along the transport path.

According to an embodiment, it is preferable that the container transport facility includes a connecting portion moving mechanism that moves the connecting portion along the transport path in synchronization with movement, in a direction along the transport path, of the container that is transported by the transport apparatus.

With this configuration, the connecting portion moves along the transport path in synchronization with the movement, in the direction along the transport path, of the container that is transported by the transport apparatus. Thus, even when the movement of the container is in progress, it is possible to switch the connecting portion to the connected state and supply the filling gas to the container.

Therefore, a longer period of time for which the filling gas can be supplied to the container midway along the transport path from the first apparatus to the second apparatus can be secured, and a container transport facility in which a suitable environment for maintaining the quality of the accommodated article is easily maintained inside the container can be realized.

According to an embodiment, it is preferable that a plurality of said connecting portions are provided distributed along the transport path.

With this configuration, since the plurality of connecting portions are provided distributed along the transport path, the filling gas can be supplied to the container at a plurality of locations on the transport path. Therefore, when compared with a case in which a connecting portion is provided at only a single location in the direction along the transport path, the filling gas can be appropriately supplied to a plurality of containers that are present on the transport path.

The invention claimed is:

1. A container transport facility comprising: a first apparatus including a pickup portion at which a container that accommodates an article is picked up;
   a second apparatus including a dropoff portion at which the container is dropped off;
   a transport apparatus that transports the container from the first apparatus to the second apparatus along a transport path; and
   a supply apparatus that supplies a filling gas to be filled into the inside of the container to the inside of the container,
   wherein:
   the container includes a flow hole forming portion in which a flow hole through which gas can flow between the outside and the inside of the container is formed,
   the supply apparatus includes a connecting portion that has a flow path through which gas can flow and a filling gas supply source that allows the filling gas to flow through the flow path, and
   the connecting portion is configured to be switchable between a non-connected state in which the connecting portion is retracted to the outside of a moving region of the container that moves along the transport path and a connected state in which the connecting portion enters the inside of the moving region and is connected to the flow hole forming portion.

2. The container transport facility according to claim 1, wherein the filling gas supply source is configured to be switchable between a supplying state in which the filling gas supply source allows the filling gas to flow through the flow path and a supply-stopped state in which the filling gas supply source does not allow the filling gas to flow through the flow path,
   further comprising a supply controller that controls switching of the connecting portion between the connected state and the non-connected state and switching of the filling gas supply source between the supplying state and the supply-stopped state, and a detector that detects a state of the filling gas within the container are provided, and
   wherein the supply controller is configured to determine whether the state of the filling gas within the container that has been detected by the detector is a supply-required state in which supply of the filling gas to the container is required or a supply-non-required state in which supply of the filling gas to the container is not required, switch the connecting portion to the connected state and the filling gas supply source to the supplying state if the state of the filling gas is determined as being the supply-required state, and switch the filling gas supply source to the supply-stopped state if the state of the filling gas is determined as being the supply-non-required state.

3. The container transport facility according to claim 2, wherein:
the transport apparatus includes a base portion whose position in a direction along the transport path is fixed, a driving portion that is supported by the base portion with its position relative to the base portion in the direction along the transport path being fixed, a contact portion that is driven by the driving portion while being in contact with the container and transmits a propulsive force in the direction along the transport path to the container, and a transport controller that controls the driving portion,
the contact portion is either one of a rotating member that is rotatably supported by the base portion and that is rotated by the driving portion and a support member that is supported by the base portion in such a manner as to be movable along the transport path and that is moved by the driving portion, and
the supply controller switches the connecting portion to the non-connected state and the filling gas supply source to the supply-stopped state if the driving portion is driven by the transport controller.

4. The container transport facility according to claim 1, further comprising:
a connecting portion moving mechanism that moves the connecting portion along the transport path in synchronization with movement, in a direction along the transport path, of the container that is transported by the transport apparatus.

5. The container transport facility according to claim 1, wherein a plurality of said connecting portions are provided distributed along the transport path.

6. The container transport facility according to claim 1, wherein the transport apparatus includes a base portion whose position in a direction along the transport path is fixed, a first support member fixed to the base portion, a second support member supporting the connecting portion of the supply apparatus, and a lifting mechanism provided between the first support member and the second support member, and
wherein by lowering the second support member by the lifting mechanism, a leading end of the connecting portion is located below the moving region and the connecting portion is switched to the non-connected state, and by lifting the second support member by the lifting mechanism, the leading end of the connecting portion enters the flow hole and the connecting portion is switched to the connected state.

7. The container transport facility according to claim 1, wherein the transport apparatus includes a first overhead transport vehicle receiving/delivering the container from/to the first apparatus, a second overhead transport vehicle receiving/delivering the container from/to the second apparatus, and a conveyor transporting the container between the first overhead transport vehicle and the second overhead transport vehicle, and
wherein the connecting portion is provided in an installation region of the conveyor among the first overhead transport vehicle, the second overhead transport vehicle and the conveyor while being switchable between the non-connected state and the connected state.

* * * * *